US010809776B2

(12) United States Patent
Lee

(10) Patent No.: US 10,809,776 B2
(45) Date of Patent: Oct. 20, 2020

(54) WATER BLOCK MOUNTING HOLDER WITH REINFORCED STRUCTURE

(71) Applicant: ASIA VITAL COMPONENTS (CHINA) CO., LTD., Shenzhen (CN)

(72) Inventor: Sung-Wei Lee, Shenzhen (CN)

(73) Assignee: ASIA VITAL COMPONENTS (CHINA) CO., LTD., Shenzhen (CN)

(*) Notice: Subject to any disclaimer, the term of this patent is extended or adjusted under 35 U.S.C. 154(b) by 0 days.

(21) Appl. No.: 16/367,269

(22) Filed: Mar. 28, 2019

(65) Prior Publication Data

US 2020/0110448 A1 Apr. 9, 2020

Related U.S. Application Data

(63) Continuation-in-part of application No. 16/150,288, filed on Oct. 3, 2018, now abandoned.

(51) Int. Cl.
| | |
|---|---|
| *H05K 7/20* | (2006.01) |
| *F28D 15/02* | (2006.01) |
| *F28D 15/06* | (2006.01) |
| *F28F 13/00* | (2006.01) |
| *F28F 13/02* | (2006.01) |
| *G06F 1/20* | (2006.01) |
| *G06F 1/18* | (2006.01) |

(52) U.S. Cl.
CPC ............. *G06F 1/20* (2013.01); *G06F 1/184* (2013.01); *H05K 7/20272* (2013.01); *G06F 2200/201* (2013.01)

(58) Field of Classification Search
CPC . H05K 7/20; F28D 15/02; F28D 15/06; F28F 13/00; F28F 13/02

USPC ........ 361/702, 699, 700; 165/56, 80.3, 80.4, 165/104.33, 908
See application file for complete search history.

(56) References Cited

U.S. PATENT DOCUMENTS

| | | | | |
|---|---|---|---|---|
| 4,328,981 A | * | 5/1982 | Greene, Jr. ............. | F16L 23/14 138/160 |
| 4,582,164 A | * | 4/1986 | Schreiner .................. | F16L 9/21 181/224 |
| 4,768,983 A | * | 9/1988 | Smith ................... | B63B 35/731 114/55.5 |
| 5,253,901 A | * | 10/1993 | Hunter .................... | F16L 9/003 138/172 |
| 5,316,075 A | * | 5/1994 | Quon ..................... | F28F 13/02 165/104.33 |

(Continued)

*Primary Examiner* — Xiaoliang Chen
(74) *Attorney, Agent, or Firm* — Demian K. Jackson; Jackson IPG PLLC

(57) ABSTRACT

A water block mounting holder with reinforced structure includes a holder body and a reinforcement structure provided on an upper side of the holder body, and is used with a water block to attach the latter to a heat-producing element mounted on a motherboard. The holder body has a hollow-out central opening and a plurality of through holes spaced along an outer area of the holder body for a plurality of fixing elements provided on the motherboard to extend therethrough and fixedly hold the holder body to the motherboard, so that the holder body is connected to the water block with the opening being fitted around the water block. With the reinforcement structure provided on the holder body, the water block mounting holder has effectively reinforced overall structural strength to avoid pressure deformation thereof.

17 Claims, 9 Drawing Sheets

(56) References Cited

U.S. PATENT DOCUMENTS

| | | | | |
|---|---|---|---|---|
| 5,647,430 | A * | 7/1997 | Tajima | F28D 15/0266 |
| | | | | 165/104.21 |
| 6,116,833 | A * | 9/2000 | Ellis | F24F 13/02 |
| | | | | 138/172 |
| 6,382,306 | B1 * | 5/2002 | Hsu | F28F 3/02 |
| | | | | 165/104.26 |
| 6,550,531 | B1 * | 4/2003 | Searls | F28D 15/0233 |
| | | | | 165/104.26 |
| 6,650,544 | B1 * | 11/2003 | Lai | F28D 15/046 |
| | | | | 165/104.21 |
| 6,808,015 | B2 * | 10/2004 | Osakabe | F28D 15/0233 |
| | | | | 165/104.21 |
| 7,942,194 | B2 * | 5/2011 | Mochizuki | H01L 23/427 |
| | | | | 165/104.21 |
| 8,591,043 | B2 * | 11/2013 | Wakabayashi | G02F 1/133308 |
| | | | | 353/52 |
| 2002/0117291 | A1 * | 8/2002 | Cheon | G06F 1/20 |
| | | | | 165/80.4 |
| 2003/0205363 | A1 * | 11/2003 | Chu | F28D 15/0266 |
| | | | | 165/80.3 |
| 2005/0224125 | A1 * | 10/2005 | Kajino | F16L 9/003 |
| | | | | 138/119 |
| 2006/0238979 | A1 * | 10/2006 | Liu | H01L 23/427 |
| | | | | 361/699 |
| 2008/0230207 | A1 * | 9/2008 | Nakamura | E04B 2/7453 |
| | | | | 165/56 |
| 2009/0200801 | A1 * | 8/2009 | Hasegawa | F16L 23/14 |
| | | | | 285/407 |
| 2011/0310359 | A1 * | 12/2011 | Wakabayashi | G02F 1/133308 |
| | | | | 353/52 |

\* cited by examiner

US 10,809,776 B2

WATER BLOCK MOUNTING HOLDER WITH REINFORCED STRUCTURE

The present application is a continuation in part of U.S. patent application Ser. No. 16/150,288, filed on Oct. 3, 2018.

FIELD OF THE INVENTION

The present invention relates to a water block mounting holder, and more particularly to a water block mounting holder having reinforced structural strength to avoid deformation thereof.

BACKGROUND OF THE INVENTION

The constantly prosperously developed electronic industry provides people with many electronic products, bringing more conveniences to their daily life. To meet consumers' demands for multifunctional and miniaturized electronic products, the currently available electronic products all have increased working frequency, which inevitably results in elevated temperature of the electronic products. Therefore, heat dissipation devices, such as radiators and fans, have been widely developed for use with heat-producing elements in the electronic products. For example, a radiator or a fan is fixedly connected to a top of a central processing unit (CPU) or a graphics processing unit (GPU), which is a prerequisite electronic element in a computer, to remove heat produced by the CPU or the GPU during operation thereof. A water block is another type of heat dissipation device, which is firmly and stably attached to the CPU or the GPU with the aid of a water block mounting holder.

The magnitude of holding pressure provided by the water block mounting holder has a direct influence on the mounting easiness and the heat dissipation effect of the water block. Generally, the water block mounting holder providing larger holding pressure enables an increased contact area and decreased thermal resistance between the water block and the CPU, and accordingly, an enhanced heat dissipation effect of the water block. However, the water block mounting holder providing excessive holding pressure might cause deformed CPU pins or damaged CPU. On the other hand, the water block mounting holder providing insufficient holding pressure might fail to tightly attach the water block to the CPU to result in a gap between the water block and the CPU. No matter how excellent the water block is in terms of its water cooling effect, thermal resistance appeared between the water block and the CPU due to the gap between them would inevitably prevent the water block from providing its originally designed heat dissipation performance. In brief, the heat dissipation effect that can be provided to the CPU by the water block has important relation to the holding pressure that is applied by the water block mounting holder against the water block. To ensure the water block mounting holder and the water block can always be used with different types of CPUs to achieve good water cooling and heat dissipation effect and to ensure normal operation of the electronic products, the water block mounting holder and the water block must pass related pressure tests before they are in real contact with the CPU.

A mounting holder pressure test unit is an apparatus specific for testing the pressure a water block mounting holder can withstand. According to the design of the currently available mounting holder pressure test unit, the water block mounting holder is fixedly held to a test platform, such as an Intel® or an AMD test platform, to undergo a pressure deformation test. Generally, a water block mounting holder is a rectangular member having a flat upper surface and a flat lower surface, and is provided with a hollow-out central opening for fitting around the water block. Locking holes are formed at four corners of the water block mounting holder to extend through the latter in a thickness direction thereof. Screws can be threaded through the locking holes to lock the water block mounting holder to a motherboard. When a water block mounting holder for use with an Intel® CPU is positioned on the test platform of the mounting holder test unit, the longer edges of the rectangular water block mounting holder are subjected to the pressure deformation test according to required specifications. Since the conventional water block mounting holders have flat upper and lower surfaces without any reinforcement structure provided thereon, they often fail to pass the longer edge pressure deformation tests required by different CPU manufacturers, such as Intel®. That is, the longer edges of the conventional flat water block mounting holders undergone the pressure deformation test tend to deform before they meet the required test specifications. It is therefore an important goal of related manufacturers to positively develop a water block mounting holder that can satisfy the pressure deformation test specifications required by different brands of CPUs, including but not limited to Intel® and AMD CPUs.

SUMMARY OF THE INVENTION

A primary object of the present invention is to provide a water block mounting holder with reinforced structural strength.

Another object of the present invention is to provide a water block mounting holder with reinforced structure for firmly holding a modular water block to a heat-producing element mounted on a motherboard, so that the modular water block can be massively produced to ensure increased production stability, reduced research and development cost, and reduced risk of quality and management control.

A further object of the present invention is to provide a water block that includes a metal upper part formed by for example hot forging and a metal lower part formed by for example CNC cutting, which are welded to each other to form a complete water block. The forming of the upper part of the water block by forging instead of complicated cutting can effectively shorten the time needed to manufacture the water block.

A still further object of the present invention is to provide a water block mounting holder with reinforced structure that is not easily deformed under pressure.

To achieve the above and other objects, the water block mounting holder with reinforced structure according to the present invention includes a holder body and a reinforcement structure provided on an upper side of the holder body, and is used with a water block to firmly attach the latter to a heat-producing element mounted on a motherboard. The holder body has a hollow-out central opening and a plurality of through holes extended through the holder body in a thickness direction thereof. The through holes are spaced along an outer area of the holder body for a plurality of fixing elements provided on the motherboard to extend therethrough and fixedly hold the holder body to the motherboard, so that the holder body is connected to the water block with the opening being fitted around the water block. With the reinforcement structure provided on the holder body, the water block mounting holder of the present invention has effectively reinforced overall structural strength to avoid deformation thereof.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1A:
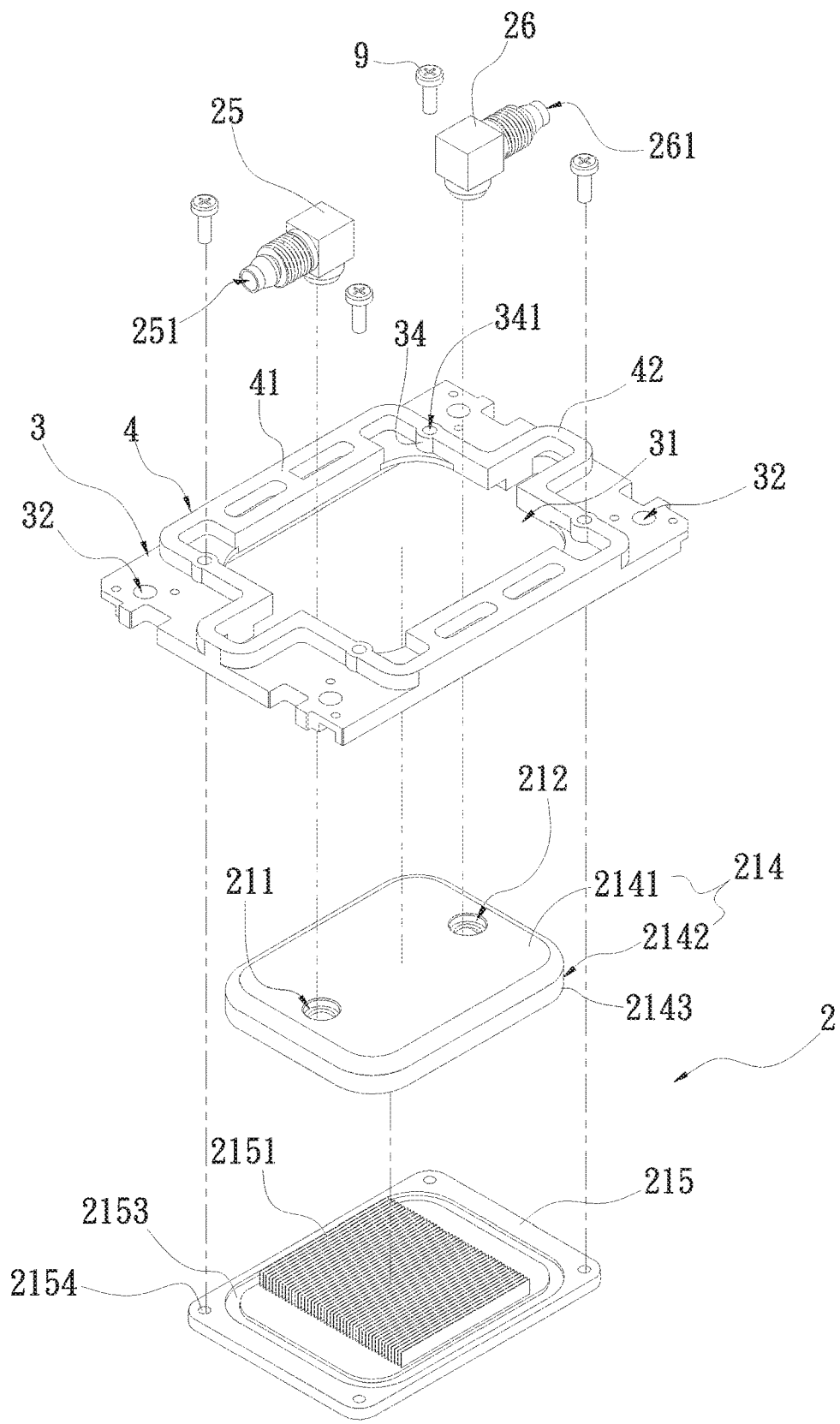
FIG. 1A is an exploded top perspective view of a water block mounting holder with reinforced structure according to a first embodiment of the present invention.

The present invention will now be described with some preferred embodiments thereof and by referring to the accompanying drawings. For the purpose of easy to understand, elements that are the same in the preferred embodiments are denoted by the same reference numerals.

Figure 1B:
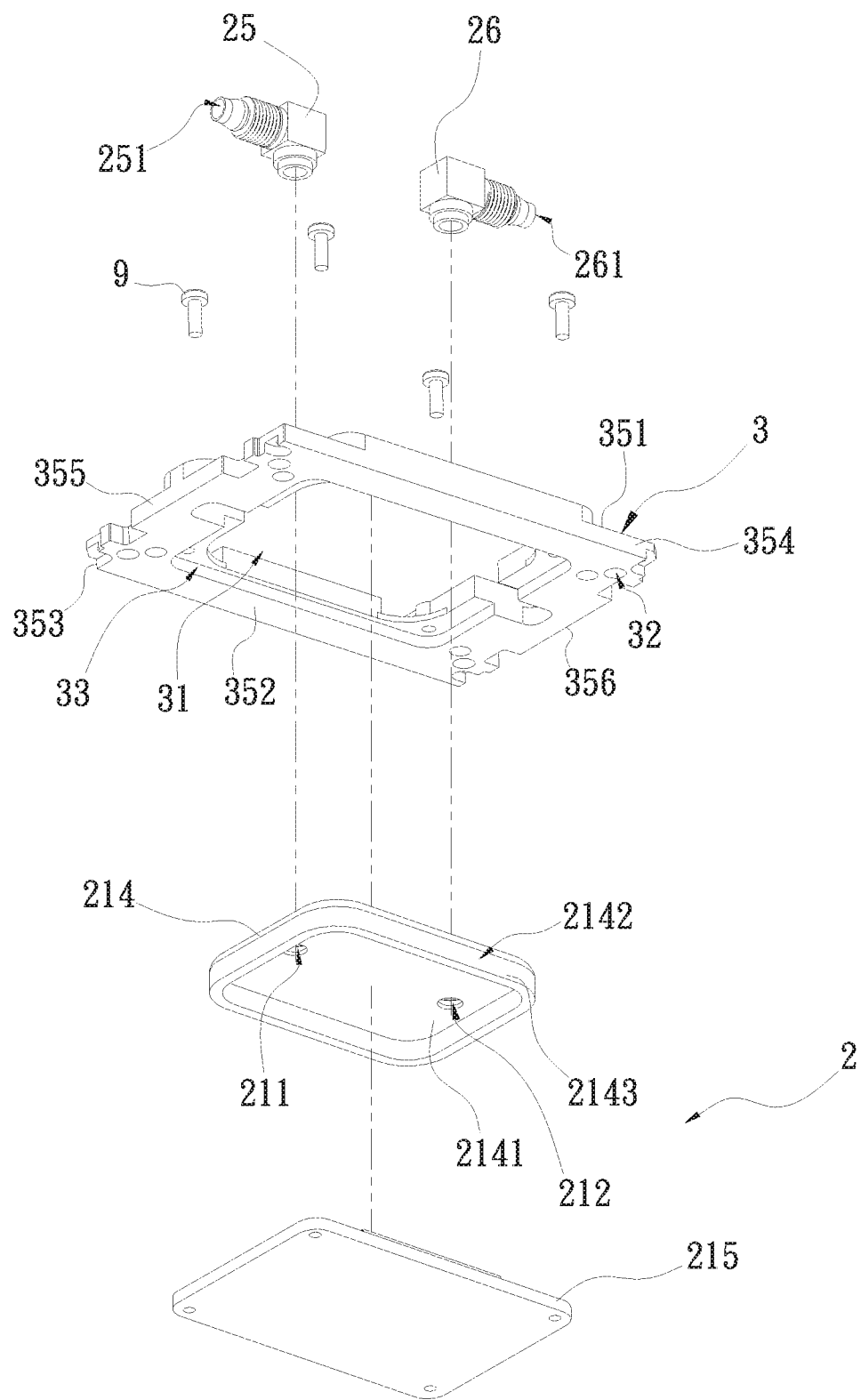
FIG. 1B is an exploded bottom perspective view of the water block mounting holder with reinforced structure according to the first embodiment of the present invention.
Figure 2:
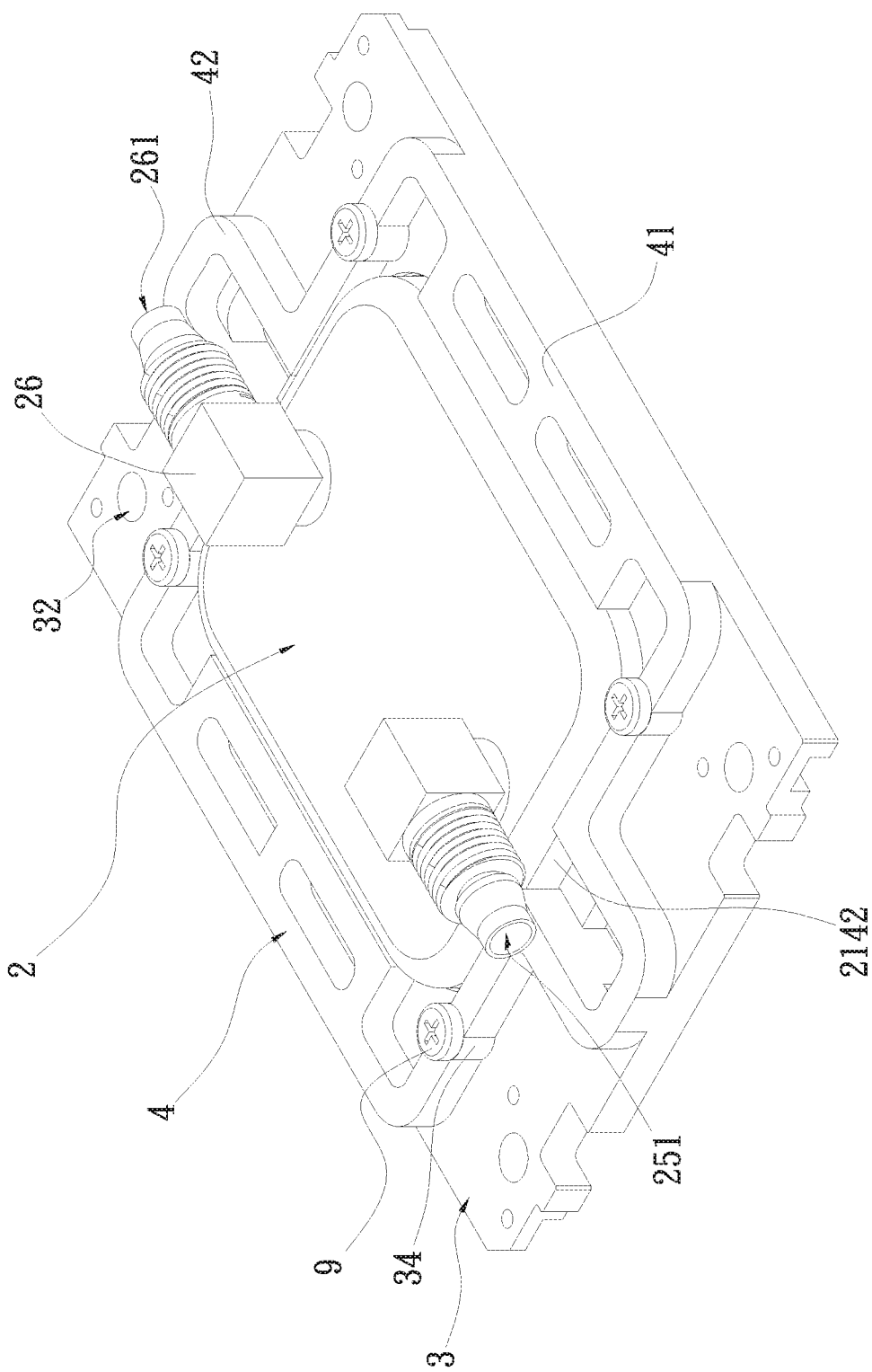
FIG. 2 is an assembled top perspective view of the water block mounting holder with reinforced structure according to the first embodiment of the present invention.
Figure 2A:
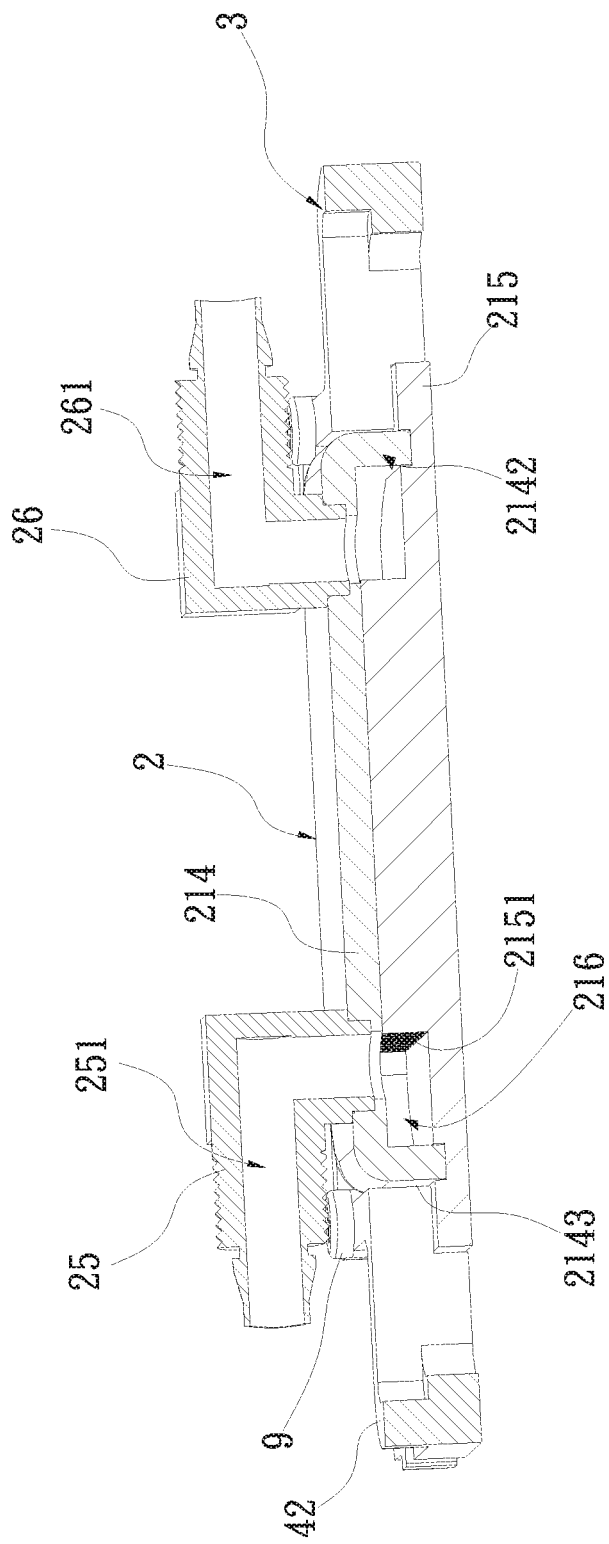
FIG. 2A is an assembled sectional side view of the water block mounting holder with reinforced structure according to the first embodiment of the present invention.
Figure 4:
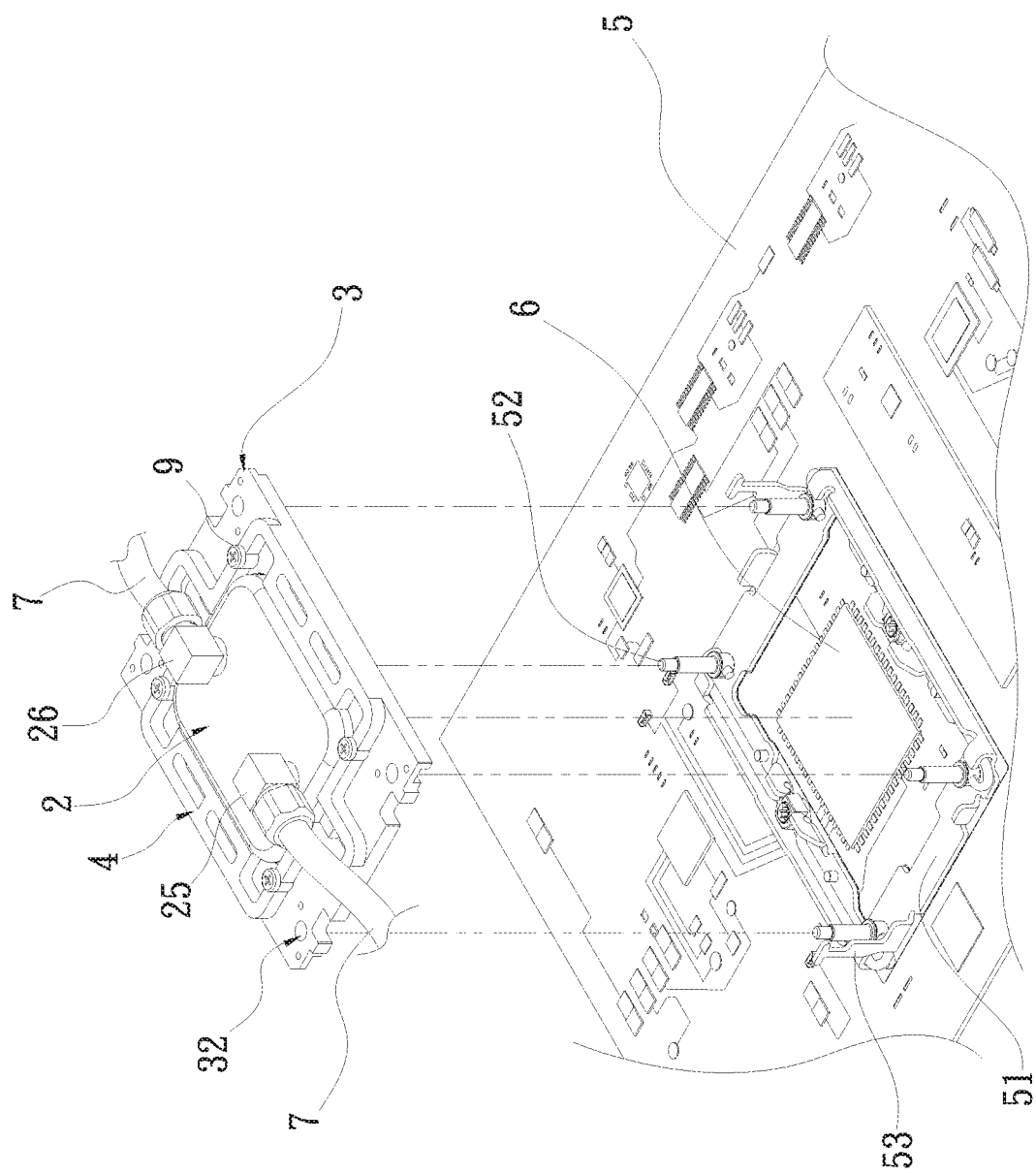
FIG. 4 is an exploded perspective view showing the use of the water block mounting holder with reinforced structure according to the first embodiment of the present invention to hold a water block to a heat-producing element mounted on a motherboard.

Please refer to FIGS. 1A and 1B, which show exploded top and bottom perspective views, respectively, of a water block mounting holder with reinforced structure according to a first embodiment of the present invention; and to FIGS. 2 and 2A, which are assembled top perspective view and sectional side view, respectively, of the water block mounting holder shown in FIGS. 1A and 1B. For the purpose of conciseness and clarity, the present invention is also briefly referred to as the water block mounting holder herein. As can be seen in FIGS. 1A, 1B and 4, the water block mounting holder is used to firmly hold a water block 2 to a heat-producing element 6 mounted on a motherboard 5. The motherboard 5 has a fixing frame 51 and a plurality of fixing elements 52 provided thereon. In the illustrated first embodiment of the present invention, the fixing elements 52 are a plurality of locating pillars provided on an upper surface of the fixing frame 51 at four corners thereof.

Please refer to FIGS. 1A, 1B, 2A and 4. The water block 2 includes an inlet 211, an outlet 212, an upper part 214, a lower part 215, and a water-receiving space 216. The inlet 211 and the outlet 212 are spaced on the upper part 214 and communicable with the water-receiving space 216. The upper part 214 is made of a metal material, such as copper, iron, aluminum, stainless steel, titanium or any alloy thereof, and is formed by forging. The upper part 214 is covered onto a top of the lower part 215. In the illustrated first embodiment of the present invention, the upper part 214 and the lower part 215 are welded to each other to form an integral unit of the water block 2. Of course, the upper and the lower part 214, 215 can also be connected to each other in other ways. The upper part 214 has a top portion 2141 and a peripheral portion 2142, which is downward extended from a peripheral edge of the top portion 2141. The inlet 211 and the outlet 212 extend through the top portion 2141 in a thickness direction thereof. The top portion 2141 and the peripheral portion 2142 of the upper part 214 and the lower part 215 together define the water-receiving space 216 in between them. A working fluid, such as pure water, flows into the water-receiving space 216 via the inlet 214.

An area located adjacent to and around a lower end of the peripheral portion 2142 is defined as a coupling zone 2143. The lower part 215 is made of a metal material, such as copper, iron, aluminum, stainless steel, titanium or any alloy thereof, and is formed by cutting, such as CNC machining. The lower part 215 and the upper part 214 are made of the same metal material. In the illustrated first embodiment of the present invention, the upper and the lower part 214, 215 are made of a copper material. The lower part 215 is provided on a top with a plurality of radiation fins 2151, which are located within the water-receiving space 216; a groove 2153, which is extended around an outer side of the radiation fins 2151 to engage with the lower end of the peripheral portion 2142; and a plurality of through bores 2154 formed on for example four corners of the lower part 215 for a plurality of fastening elements 9, such as screws, to thread therethrough.

The inlet 211 on the upper part 214 is connected to an end of a first connector 25, and the outlet 212 is connected to an end of a second connector 26. The first and the second connector 25, 26 are connected at respective another end to two water tubes 7. The first and the second connector 25, 26 internally define a first and a second communicating bore 251, 261, respectively. The first and the second communicating bore 251, 261 communicate with the water-receiving space 216 via the inlet 211 and the outlet 212, respectively. The first and the second connector 25, 26 are connected to a water-cooling device (not shown), which includes a water-cooling radiator structure and a pump, via the water tubes 7. The radiation fins 2151 in the water-receiving space 216 absorb heat produced by the heat-producing element 6 and exchange the absorbed heat with the working fluid, and the working fluid carrying the heat flows through the outlet 212, the second communicating bore 261 and the correspondingly connected water tube 7 into the pump. The pump drives the heated working fluid to flow into the water-cooling radiator structure, at where the working fluid is cooled and flows through the other water tube 7, the first communicating bore 251 and the inlet 211 into the water-receiving space 216 again. The working fluid keeps circulating through the water block 2, the water-cooling device and the water tubes 7 in the above-described manner to achieve a water-cooling effect.

The water block mounting holder of the present invention includes a holder body 3 and a reinforcement structure 4 provided on an upper side 351 of the holder body 3. The holder body 3 can be made of a metal material or a plastic material or a composite of metal and plastic. The metal material can be, for example, aluminum, iron, stainless steel, commercially pure titanium, titanium or any alloy thereof. In the illustrated first embodiment, the holder body 3 is made of an aluminum material, and is substantially rectangular in shape. The holder body 3 has an upper side 351, a lower side 352 opposite to the upper side 351, two longer edges, namely, a first edge 353 and an opposite second edge 354, and two shorter edges, namely, a third edge 355 and an opposite fourth edge 356. In practical implementation of the present invention, the holder body 3 can also be made of other materials and in other shapes, such as in the form of a square or a rhombus.

The holder body 3 can be formed by machining, such as computer numerical control (CNC) machining, die casting, stamping or forging. The holder body 3 is attached to the top of the lower part 215 of the water block 2, and includes a hollow-out central opening 31, a plurality of through holes 32, and a holding space 33. The opening 31 and the through holes 32 are not communicable with the water-receiving space 216 in the water block 2, but extend through the holder body 3 in a thickness direction thereof. In the illustrated first embodiment of the present invention, the opening 31 has a width larger than that of the upper part 214 of the water block 2 but smaller than that of the lower part 215. The through holes 32 are spaced along an outer area of the holder body 3 for the locating pillars (i.e. the fixing elements 52) on the motherboard 5 to extend therethrough and fixedly hold the holder body 3 to the motherboard 5. In the illustrated first embodiment, there are shown four through holes 32 corresponding to the four fixing elements 52. The motherboard 5 is also provided with a plurality of extended sections 53, which are located at two opposite frame sections of the fixing frame 51 for further stably clamping the holder body 3 in place on the fixing frame 51 and accordingly, indirectly stably attaching the water block 2 to the heat-producing element 6, which can be a central processing unit (CPU), a graphics processing unit (GPU), or an application-specific integrated circuit (ASIC), so that the lower part 215 of the water block 2 is firmly attached to the heat-producing element 6 to dissipate heat from the latter through circulated water cooling.

In addition, the heat-producing element 6 used with the holder body 3 in the first embodiment of the present invention can include, but not limited to, Intel® CPU-i9, and the motherboard 5 can include, but not limited to, one that has this type of heat-producing element 6 mounted thereon. The number, position, size and shape of the through holes 32 formed on the holder body 3 can be determined or adjusted in advance according to the brand, the specification and the model of the heat-producing element 6 and to match the number, position and shape of the fixing elements 52 provided on the fixing frame 51 on the motherboard 5 for holding the holder body 3 in place.

The holder body 3 further includes a plurality of fastener receiving sections 34, which are formed on the upper side 351 of the holder body 3 and located corresponding to the through bores 2154 on the lower part 215 of the water block 2. In the illustrated first embodiment, the fastener receiving sections 34 are located adjacent to the opening 31 and respectively internally define a connecting bore 341, through which the fastening elements 9, such as screws, are threaded into the through bores 2154 formed on the lower part 215 of the water block 2, so that the lower side 352 of the holder body 3, which is also the lower side of the holding space 33 of the holder body 3, is in firm and tight contact with the top of the lower part 215 of the water block 2. The holder body 3 is connected to the water block 2 with the opening 31 being fitted around the water block 2. More specifically, the holder body 3 is connected to the water block 2 with the coupling zone 2143 of the peripheral portion 2142 of the water block 2 received in the opening 31 of the holder body 3, while the top portion 2141 and an area of the peripheral portion 2142 located adjacent to the top portion 2141 of the water block 2 are located above and exposed from the opening 31. In the illustrated first embodiment, the lower part 215 of the water block 2 is connected to the holder body 3 by means of screws. However, it is understood, in practical implementation of the present invention, the lower part 215 of the water block 2 can also be connected to the holder body 3 in other ways, including but not limited to scarf joint, screw-fastening, bonding and snap-fitting. The holding space 33 is a downward opened recess formed on the lower side 352 of the holder body 3 and is communicable with the opening 31. The lower part 215 of the water block 2 is correspondingly held in the holding space 33 while a bottom side of the lower part 215 is flush with the lower side 352 of the holder body 3. Alternatively, in another operable embodiment, the peripheral portion 2142 of the upper part 214 of the water block 2 can be connected to the holder body 3 by soldering, scarf-joint, snap-fitting, or bonding.

In an alternative embodiment, the holding space 33 of the holder body 3 has a width equal to that of an outer periphery of the top portion 2141 of the upper part 214 of the water block 2, so that the outer periphery of the top portion 2141 of the upper part 214 is fitted in the holding space 33, allowing the holder body 3 and the upper part 214 of the water block 2 to connect to each other by press-fit. For example, a joining force that is produced by the holder body 3 when the holder body 3 is fixedly connected to the fixing elements 52 on the fixing frame 51 on the motherboard 5 generates a downward force against the upper part 214 of the water block 2, bringing the holder body 3 to press against and accordingly, connect to the upper part 214 of the water block 2 and allowing the latter to more tightly and stably contact with the heat-producing element 6.

The reinforcement structure 4 includes two first reinforcement sections 41 formed along and adjacent to the two opposite longer edges of the holder body 3, i.e. along the first edge 353 and the second edge 354; and two second reinforcement sections 42 formed along and adjacent to the two opposite shorter edges of the holder body 3, i.e. along the third edge 355 and the fourth edge 356. In the illustrated first embodiment of the present invention, the first and the second reinforcement sections 41, 42 are integral parts of the holder body 3. More specifically, in the first embodiment, the first and the second reinforcement sections 41, 42 are respectively in the form of a rib, which is directly formed on the upper side 351 of the holder body 3 by means of cutting, such as CNC machining, which is a type of controlled material-removal process; and the first and the second reinforcement sections 41, 42 are integrally connected to one another to form one single continuous rib. In practical implementation of the present invention, the first and the second reinforcement sections 41, 42 can be respectively a solid rib or a partially sunken rib raised from the upper side 351 of the holder body 3; and are located adjacent to and extended along the four edges 353, 354, 355, 356 of the holder body 3. Alternatively, the first reinforcement sections 41 are omitted with only the second reinforcement sections 42 formed on the upper side 351 of the holder body 3 to extend along two opposite longer or shorter edges thereof (not shown).

Figure 3A:
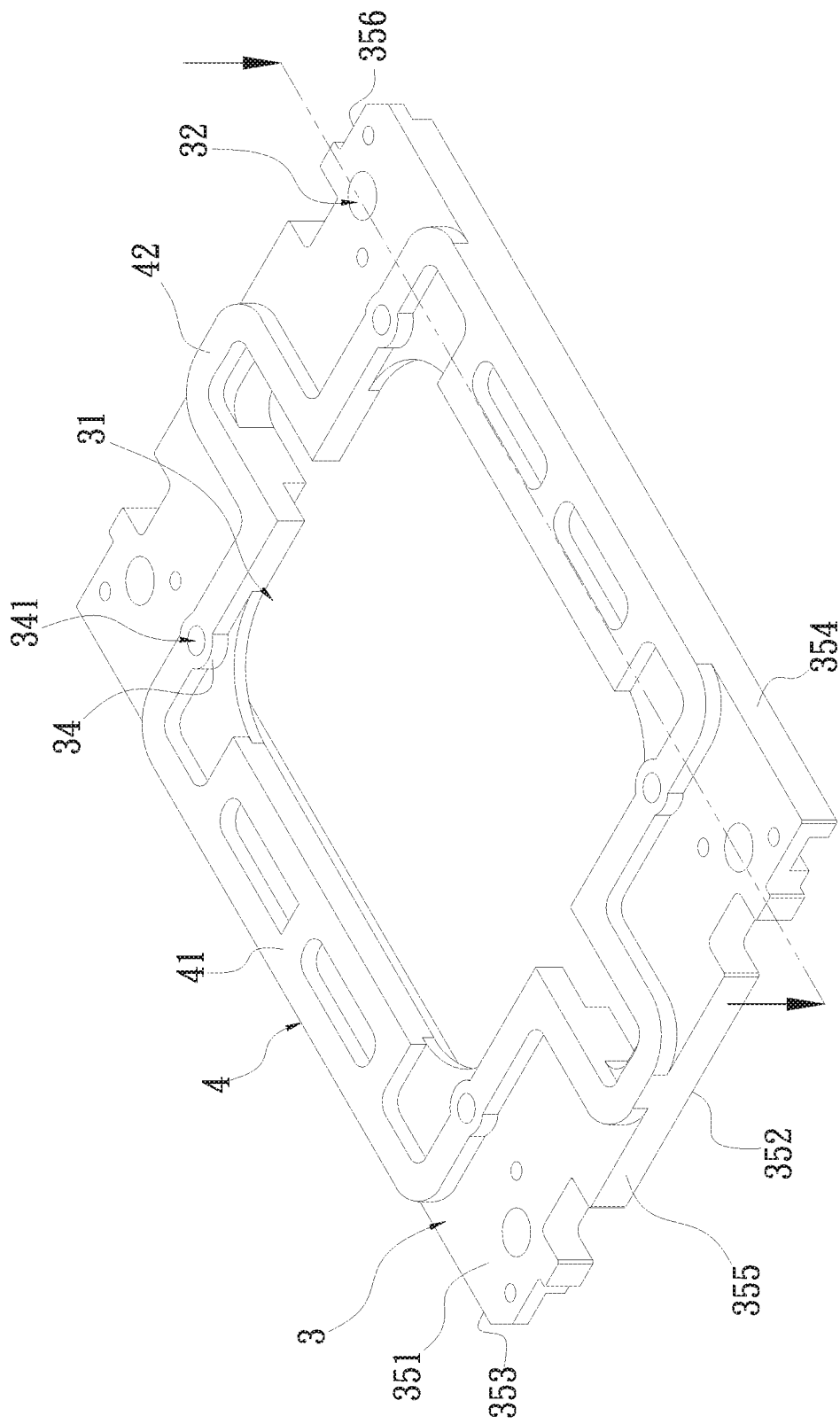
FIG. 3A is an assembled top perspective view of an alternative embodiment of the water block mounting holder with reinforced structure according to the first embodiment of the present invention.
Figure 3B:
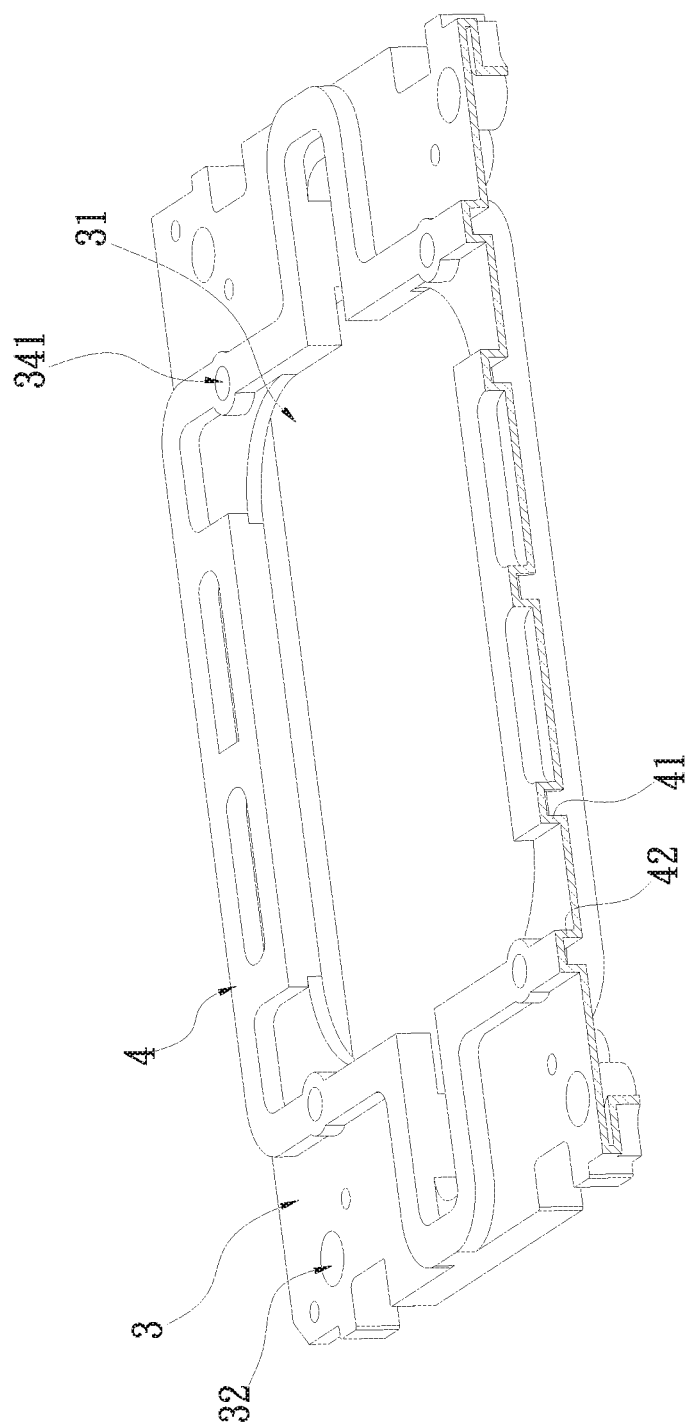
FIG. 3B is a cutaway view of the water block mounting holder with reinforced structure shown in FIG. 3A.

In an alternatively embodiment, the first and the second reinforcement sections 41, 42 are integrally formed on the upper side 351 of the holder body 3 by die casting or machining (such as CNC machining). Or, in another alternatively embodiment as shown in FIGS. 3A and 3B, the holder body 3 is formed by die casting and the first and second reinforcement sections 41, 42 are then integrally formed on the upper side 351 of the holder body 3 by machining such as CNC machining, or by stamping. In a further alternatively embodiment, the first and the second reinforcement sections 41, 42 can be independent elements welded to the upper side 351 of the holder body 3.

In the first embodiment, the first reinforcement sections 41 are raided from the upper side 351 of the holder body 3 to extend near and along the first and the second edge 353, 354, while the second reinforcement sections 42 are raised from the upper side 351 of the holder body 3 to extend near and along the third and the fourth edge 355, 356. Further, the first and second reinforcement sections 41, 42 are integrally formed on the upper side 351 of the holder body 3 to extend along and corresponding to the shape of the opening 31. The first reinforcement sections 41 are respectively a raised, partially sunken rib having a substantially I-shaped configuration or ⊟-shaped configuration; and the second reinforcement sections 42 are respectively a raised, solid, continuously extended rib having a substantially U-shaped configuration. The first and the second reinforcement sections 41, 42 alternately formed along the longer and shorter edges of the holder body 3 not only give the holder body 3 increased overall structural strength, but also effectively give the longer and the shorter edges of holder body 3 enhanced structural strength. For instance, when the water block mounting holder with reinforced structure according to the present invention usable with an Intel® or other brands of CPUs is undergone a pressure deformation test using a corresponding mounting holder pressure test unit (not shown), the test result indicates the reinforcement structure 4 of the present invention indeed reinforces or strengthens the longer and the shorter edges of the holder body 3, enabling the water block mounting holder of the present invention to not only meet the pressure deformation test specifications required by different brands of CPU manufacturers, but also provide even better structural strength and proof pressure to avoid the four edges (i.e. the first, second, third and fourth edges 353, 354, 355, 356) of the holder body 3 from deformation due to the locking force applied thereto by the fastening elements 9 that lock the holder body 3 to the water block 2. In practical implementation of the present invention, the first and the second reinforcement sections 41, 42 are not necessarily limited to the shapes, number and locations illustrated in the first embodiment. Any and all reinforcement structures provided on the upper side 351, the lower side 352, or both of the upper and lower sides 351, 352 of the holder body 3 are in the scope of the reinforcement structure 4 (i.e. the first and the second reinforcement sections 41, 42) of the present invention. Further, the number, the shape and the thickness of the first and the second reinforcement sections 41, 42 provided on the upper side 351, the lower side 352 or the upper and lower sides 351, 352 of the holder body 3 are designed and adjustable according to the required structural strength and proof locking pressure of the water block mounting holder, in order to give the holder body 3 increased structural strength and upgraded proof pressure.

With the present invention, the forged upper part 214 and the CNC cut lower part 215 can be welded together to provide a modular water block 2 and the holder body 3 can be manufactured according to specific brands, specifications or models of heat-producing elements. By using the modular water block 2 with the holder body 3 of the present invention, the modular water block 2 provides high exchangeability and can be applied to heat-producing elements 6 of various brands, different specifications and models to save a lot of management costs, reduce the risk in quality control, increase production stability, upgrade production efficiency, achieve effective mass production, and reduce manufacturing costs. Further, in research and development of the water block mounting holder of the present invention, manufacturers need only to design the configuration of the holder body 3 and the positions of the through holes 32 on the holder body 3 corresponding to the required locking manners, brands, specifications and models of the heat-producing elements 6, which largely shortens the development time and reduces the development costs of the water block mounting holder.

Since the modular water block 2 according to the present invention is not intended to be directly locked to the motherboard 5, it is not necessary to reserve extra areas for forming locking holes on the water block 2 for locking the latter to the motherboard 5. This allows the modular water block 2 to have reduced overall weight and manufacturing cost. Also, by forming the upper part 214 of the modular water block 2 through forging, such as hot forging, it is able to effectively solve the problems of complicated processing procedures and extended processing time in CNC cutting.

With the water block mounting holder having reinforced structure according to the present invention, the holder body 3 not only has effectively increased structural strength to avoid deformation, but also has the advantages of reduced manufacturing costs, reduced overall weight, effective mass production and upgraded production efficiency. Further, the modular water block 2 provides high exchangeability because it can be used with different versions of holder bodies 3, which are designed corresponding to, for example, heat-producing elements 6 of different brands, specifications, models and heat dissipation characteristics and capability, or have radiation fins 2151 provided thereon, and can accordingly, effectively reduce the manufacturing cost and achieve mass production. The modular water block 2 can also be advantageously conveniently assembled and disassembled to and from the holder body 3.

Figure 5:
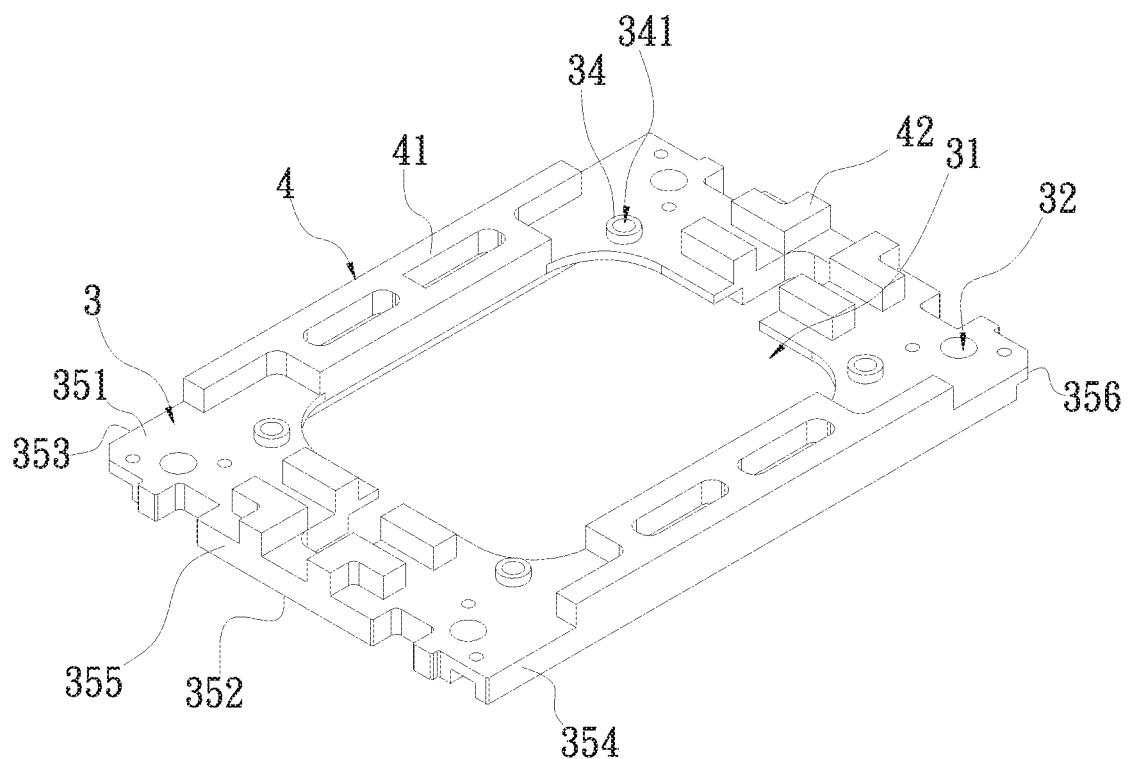
FIG. 5 is an assembled top perspective view of a water block mounting holder with reinforced structure according to a second embodiment of the present invention.
Figure 5A:
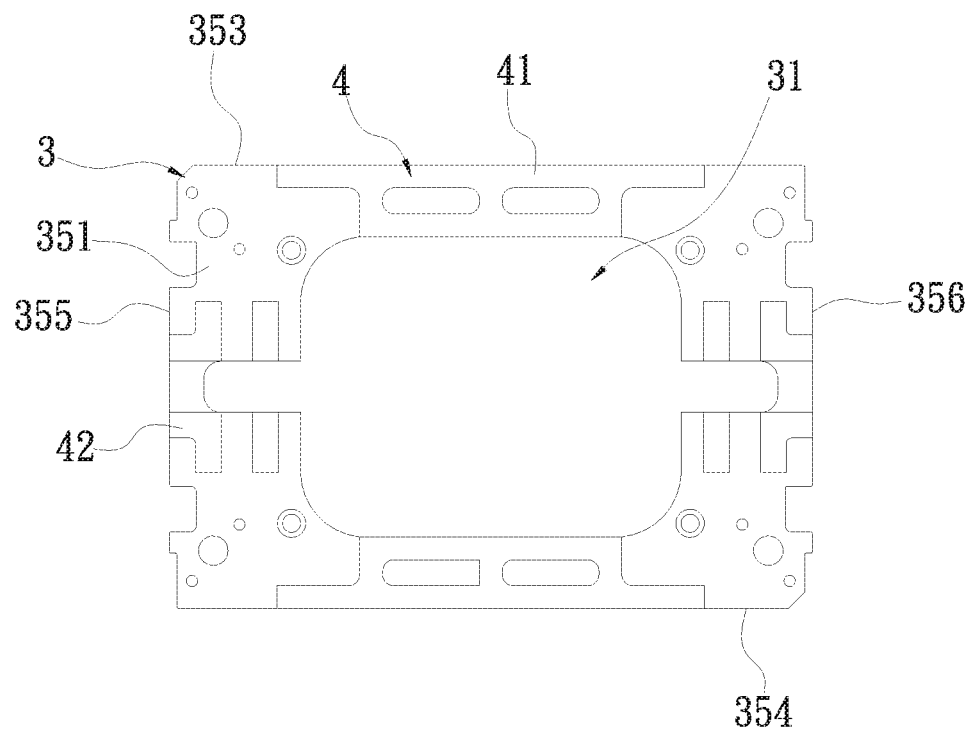
FIG. 5A is a top plan view of FIG. 5.

FIGS. 5 and 5A are top perspective and plan views, respectively, of a water block mounting holder according to a second embodiment of the present invention. Please refer to FIGS. 5, 5A along with FIGS. 1A and 4. The water block mounting holder in the second embodiment is generally structurally similar to the first embodiment but has a plurality of second reinforcement sections 42 provided on the upper side 351 of the holder body 3 adjacent to each of the third and the fourth edge 355, 356. In FIGS. 5 and 5A, four pieces of second reinforcement sections 42 are shown at each of the third and the fourth edge 355, 356. For example, two of the four pieces second reinforcement sections 42 provided adjacent to each of the two shorter edges 355, 356 can be substantially L-shaped ribs while the other two can be straight ribs. The four second reinforcement sections 42 provided adjacent to the third edge 355 and the four second reinforcement sections 42 provided adjacent to the fourth edge 356 are symmetrical in shape and in position. And, in the second embodiment, the first reinforcement sections 41 provided along the first and the second edge 353, 354 of the holder body 3 are not connected to the second reinforcement sections 42 provided adjacent to the third and the fourth edge 355, 356.

Figure 6:
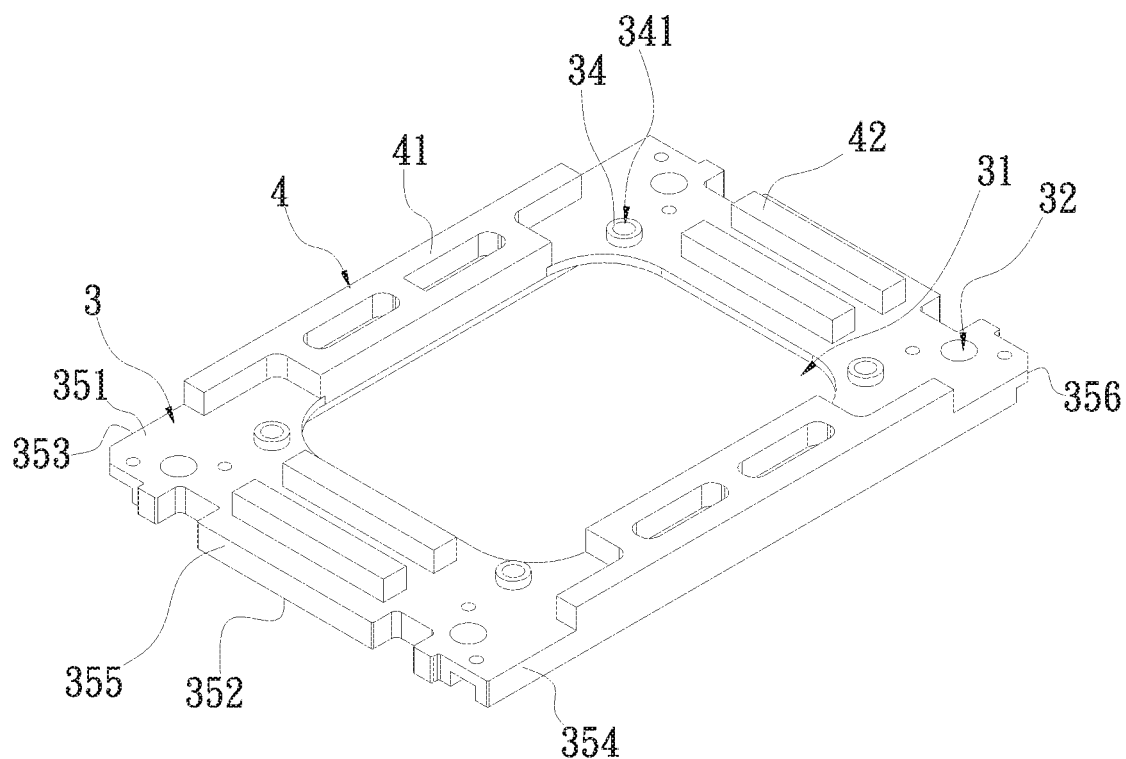
FIG. 6 is an assembled top perspective view of a water block mounting holder with reinforced structure according to a third embodiment of the present invention.
Figure 6A:
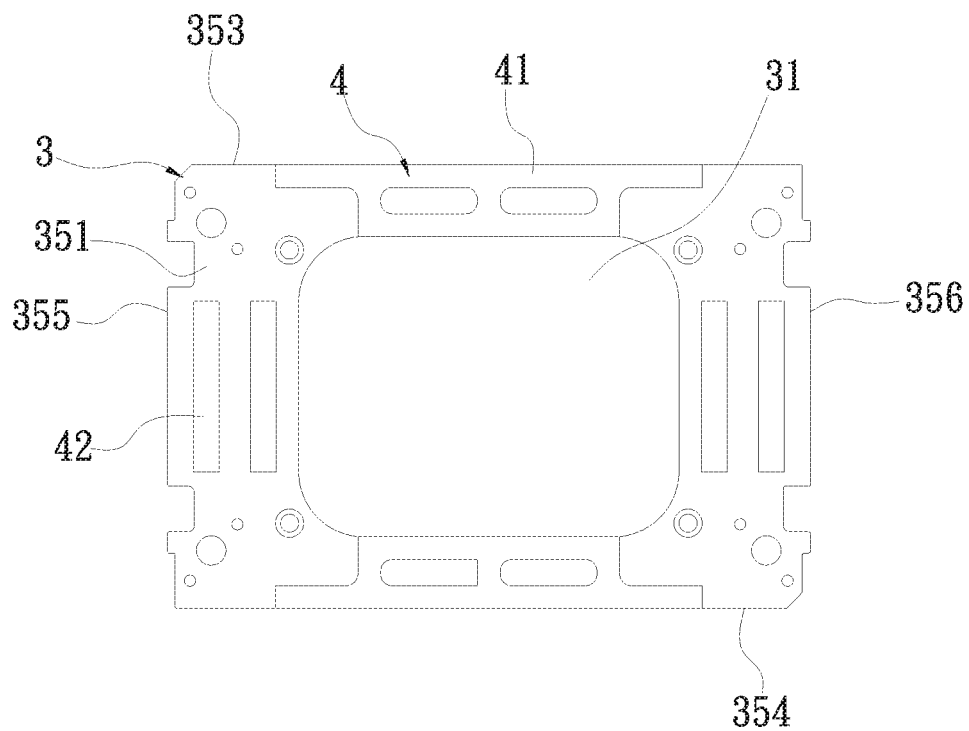
FIG. 6A is a top plan view of FIG. 6.

FIGS. 6 and 6A are top perspective and plan views, respectively, of a water block mounting holder according to a third embodiment of the present invention. Please refer to FIGS. 6, 6A along with FIGS. 1A and 4. The water block mounting holder in the third embodiment is generally structurally similar to the second embodiment but the plurality of second reinforcement sections 42 provided on the upper side 351 of the holder body 3 adjacent to each of the third and the fourth edge 355, 356 include, for example, two transversely parallelly extended straight ribs. Again, the two pieces of second reinforcement sections 42 provided adjacent to the third edge 355 and the two pieces of second reinforcement sections 42 provided adjacent to the fourth edge 356 are symmetrical in shape and in position.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A water block mounting holder with reinforced structure, being used with a water block to attach the water block to a heat-producing element mounted on a motherboard, the water block mounting holder comprising:

a holder body having a hollow-out central through-hole-opening and a plurality of through holes that extend through the holder body in a thickness direction thereof; the through holes being spaced along an outer area of the holder body for a plurality of fixing elements provided on the motherboard to extend therethrough and fixedly hold the holder body to the motherboard; and the holder body being connected to the water block with the through-hole-opening being fitted around the water block with the water block extending therethrough; and a reinforcement structure being provided on an upper side of the holder body.

2. The water block mounting holder with reinforced structure as claimed in claim 1, wherein the reinforcement structure includes two first reinforcement sections formed on the upper side of the holder body to extend along and adjacent to a first pair of two opposite edges of the holder body.

3. The water block mounting holder with reinforced structure as claimed in claim 2, wherein the reinforcement structure further includes two second reinforcement sections formed on the upper side of the holder body to extend along and adjacent to a second pair of two opposite edges of the holder body.

4. The water block mounting holder with reinforced structure as claimed in claim 3, wherein the holder body has a first edge, a second edge opposite to the first edge, a third edge, and a fourth edge opposite to the third edge; the two first reinforcement sections being raised from the upper side of the holder body to extend along and adjacent to the first and the second edge; and the two second reinforcement sections being raised from the upper side of the holder body to extend along and adjacent to the third and the fourth edge.

5. The water block mounting holder with reinforced structure as claimed in claim 3, wherein the two first reinforcement sections are integrally connected to the two second reinforcement sections.

6. The water block mounting holder with reinforced structure as claimed in claim 1, wherein the water block includes an upper part, a lower part for covering a lower side of the upper part, an inlet, an outlet, and a water-receiving space; the inlet and the outlet being spaced on the upper part and communicable with the water-receiving space, and a working fluid flowing into the water-receiving space via the inlet.

7. The water block mounting holder with reinforced structure as claimed in claim 6, wherein the upper part of the water block has a top portion and a peripheral portion downward extended from a peripheral edge of the top portion; the inlet and the outlet being spaced on the top portion to extend through the latter in a thickness direction thereof; an area located adjacent to and around a lower end of the peripheral portion being a coupling zone; and the holder body being connected to the water block with the coupling zone received in the opening of the holder body.

8. The water block mounting holder with reinforced structure as claimed in claim 7, wherein the lower part of the water block has a top facing toward and connected to the holder body; the lower part being provided on the top with a plurality of radiation fins that are located within the water-receiving space, a groove that is extended around an outer side of the radiation fins to face and engage with the lower end of the peripheral portion of the upper part of the water block, and a plurality of through bores formed on four corners of the lower part.

9. The water block mounting holder with reinforced structure as claimed in claim 8, wherein the holder body includes a plurality of fastener receiving sections formed on the upper side of the holder body and located corresponding to the through bores formed on the lower part of the water block; the fastener receiving sections respectively internally defining a connecting bore, through which fastening elements can be threaded into the through bores to ensure firm and tight contact of a lower side of the holder body with the top of the lower part of the water block.

10. The water block mounting holder with reinforced structure as claimed in claim 9, wherein the holder body further has a holding space, which is a downward opened recess formed on the lower side of the holder body and is communicable with the opening; and the lower part of the water block being correspondingly held in the holding space while a bottom side of the lower part is flush with the lower side of the holder body.

11. The water block mounting holder with reinforced structure as claimed in claim 6, wherein the inlet on the upper part of the water block is connected to an end of a first connector and the outlet is connected to an end of a second connector; the first and the second connector being connected at respective another end to two water tubes; and the first and the second connector internally defining a first and a second communicating bore, respectively, which communicate with the water-receiving space of the water block via the inlet and the outlet, respectively.

12. The water block mounting holder with reinforced structure as claimed in claim 6, wherein the upper part and the lower part of the water block are connected to each other by welding; and wherein the upper part of the water block and the holder body are connected to each other in a manner selected from the group consisting of soldering, screw-fastening, press-fit, bonding, snap-fit and scarf-joint.

13. The water block mounting holder with reinforced structure as claimed in claim 6, wherein the upper part and the lower part of the water block are connected to each other by welding; and wherein the lower part of the water block and the holder body are connected to each other in a manner selected from the group consisting of screw-fastening, soldering, press-fit, bonding, snap-fit and scarf-joint.

14. The water block mounting holder with reinforced structure as claimed in claim 6, wherein the upper part of the water block is made of a metal material and formed by forging, and the lower part of the water block is made of a metal material and formed by cutting; the upper part and the lower part being made of the same metal material, and the metal material being selected from the group consisting of copper, iron, aluminum, stainless steel, titanium, and any alloy thereof.

15. The water block mounting holder with reinforced structure as claimed in claim 1, wherein the holder body is made of a metal material, selected from the group consisting of aluminum, iron, stainless steel, commercially pure titanium, titanium, and any alloy thereof; and wherein the holder body is formed in a manner selected from the group consisting of machining, die casting, stamping and forging.

16. The water block mounting holder with reinforced structure as claimed in claim 6, wherein the lower part of the water block is attached to the heat-producing element mounted on the motherboard; and the motherboard is further provided with a fixing frame and a plurality of extended sections; the fixing elements provided on the motherboard being located on an upper surface of the fixing frame to extend through the through holes on the holder body; and the extended sections being located at two opposite frame sections of the fixing frame for further stably clamping the holder body in place on the fixing frame.

17. The water block mounting holder with reinforced structure as claimed in claim 3, wherein the first and the second reinforcement sections are respectively in the form of a rib raised from the upper side of the holder body; and the rib having a configuration selected from a group consisting of a solid rib and a partially sunken rib.

\* \* \* \* \*